(12) United States Patent
Papenbreer et al.

(10) Patent No.: US 7,327,579 B2
(45) Date of Patent: Feb. 5, 2008

(54) MODULAR SAFETY SYSTEM HAVING HIDDEN SETTING MEANS

(75) Inventors: Rudolf L. Papenbreer, Wuppertal (DE); Norbert Machuletz, Wetter (DE); Dirk Lorenz, Hagen (DE)

(73) Assignee: Rockwell Automation Germany GmbH & Co. KG, Wuppertal (DE)

( * ) Notice: Subject to any disclaimer, the term of this patent is extended or adjusted under 35 U.S.C. 154(b) by 217 days.

(21) Appl. No.: 11/243,396

(22) Filed: Oct. 4, 2005

(65) Prior Publication Data

US 2006/0087791 A1  Apr. 27, 2006

(30) Foreign Application Priority Data

Oct. 8, 2004  (EP) ................. 04 023 987

(51) Int. Cl.
*H05K 7/00* (2006.01)
(52) U.S. Cl. ............... 361/729; 361/752; 361/790; 361/797
(58) Field of Classification Search ............... 361/729, 361/790, 797, 800, 752, 807, 810; 312/223
See application file for complete search history.

(56) References Cited

U.S. PATENT DOCUMENTS

| 4,558,914 | A | * | 12/1985 | Prager et al. | ............... 439/259 |
| 4,985,845 | A | * | 1/1991 | Gotz et al. | .................. 700/286 |
| 6,033,257 | A | * | 3/2000 | Lake et al. | ................. 439/502 |
| 2003/0058623 | A1 | | 3/2003 | Veil et al. | |

OTHER PUBLICATIONS

T. Frederickson, et al., Comparison of Fault Tolerant Controllers Used in Safety Applications, ISA Transactions, 1991, pp. 97-106, vol. 30, No. 4, Pittsburgh, USA.

* cited by examiner

*Primary Examiner*—Dean A. Reichard
*Assistant Examiner*—Hung S Bui
(74) *Attorney, Agent, or Firm*—Quarles & Brady, LLP; William R. Walbrun

(57) ABSTRACT

A modular safety system for safety control in emergency stop applications includes a base module and at least one extension module, wherein each module is arranged in a housing with a rail-mounting base, so that the modules are located in a side-by-side arrangement when mounted to the rail. The modular safety system also includes means for setting of required input and output functions, wherein the setting means is located in a side wall of the module housing, so that after mounting the modules to the rail, the setting means is covered by an adjacent module.

11 Claims, 2 Drawing Sheets

MODULAR SAFETY SYSTEM HAVING HIDDEN SETTING MEANS

CROSS REFERENCE TO RELATED APPLICATIONS

This application is based on European Application Serial No. 04 023 987.3 filed Oct. 8, 2004, and entitled "Modular Safety System Having Hidden Setting Means", and claims the benefit thereof.

BACKGROUND OF THE INVENTION

The invention relates to a modular safety system for safety control in emergency stop applications and, in particular, to industrial emergency stop applications.

Modular safety systems for safety control in emergency stop applications are, for example, used for the control of robot cells, wherein the access to the robot cell and the operation of said robot must be controlled under various manufacturing conditions. Usually, the inputs to such a modular safety system include an emergency stop switch, a safety gate with an additional monitored door fastening device, safety mats, safety light curtains, and the robot position. Depending on the input conditions, an output signal is created by the modular safety system to switch a safety relay for an emergency stop of the robot. Various other applications in industrial safety control exist.

For simple manufacturing tasks, safety switching devices are very widely spread; however, in fully automated manufacturing plants they are limited for cost reasons or because they do not provide for diagnosis and monitoring in higher order controllers. On the other side, complex failure safe controllers are used in extremely sophisticated manufacturing facilities; however, they are too costly for small and mid-range applications because further programming systems are required resulting in high engineering costs and the handling can only be done be specifically trained staff.

In mid-rage and even in small-range applications, modular safety systems are used due to their cost-effectiveness.

One of those known modular safety systems is the F-200-system, which is commercially available from Tesch GmbH & Co. KG, Wuppertal. This modular safety system includes a base module, which has two input channels with a single, dual or three-channel activation, independently of one another. Therefore, for example, an emergency stop switch and a safety gate with an additionally monitored door fastening device can be connected, so that each contact can be monitored independently. Also, foot switch mats or safety mats and safety light curtains with relay outputs can be used as initiating devices. The base module monitors the individual channels constantly to check the connection to one another and to check for interruptions. It opens the safety contacts if either an appropriate E-stop or fault condition occurs. The status of input/output and diagnostic information are indicated by LED lamps, signalled by relay contacts and semiconductor outputs, and transmitted to a serial data interface on the front of the module. That base module may be expanded by additional safety input extension modules and/or contact extension modules.

A further example of a known modular safety system is the safety center that is commercially available from Schleicher Elektronik GmbH & Co. KG, D-13597 Berlin and includes a base module and at least one input module. The safety center has two multifunction groups A and B, which can operate as independent devices or be combined with one another. Separate or joint operation of the input circuit groups A and B on the input module is configured with a switch on the front of the base module. Input function selection is done by the use of two rotary switches located in the front plane of the input module.

Both known modular safety systems have the disadvantage that the setting means for the required input and output functions are easy accessible even for unauthorized personnel.

It would therefore be desirable to improve the safety features of a modular safety system for safety control in emergency stop applications.

SUMMARY OF THE INVENTION

A modular safety system for safety control in emergency stop applications is disclosed that includes a base module and at least one extension module, wherein each module is arranged in a housing with a rail-mounting base so that the modules are located side by side to each other after mounting to said rail. The modular safety system further includes means for setting the required input and output functions, wherein the setting means is located on a side wall of the module housing, so that after mounting of the at least two modules to the rail the setting means is covered or hidden by a housing side wall of the adjacent module.

Accordingly to one embodiment, the setting means is provided at a housing side wall of the at least one extension module. In particular, the extension module may be an input module with one or more input channels, for example, two input channels. Preferably, the input channels include single, dual, or three channel activation.

Additionally, the setting means may include rotary switches. In this regard, system redundancy may be provided by the use of two independent rotary switches for the input functions and two independent rotary switches for the output functions. Further, the modular safety system may include at least one output module for the control of the safety contacts. In other words, the control of the safety relays or safety contacts may be dislocated from the base module to an output module, to further enhance the modularity of the modular safety system.

In accordance with another embodiment, the base module may include a 35 millimeter (mm) housing, the input module may include a 17.5 mm housing, and the output module may include a 22.5 mm housing.

DETAILED DESCRIPTION OF THE PREFERRED EMBODIMENT

Figure 1:
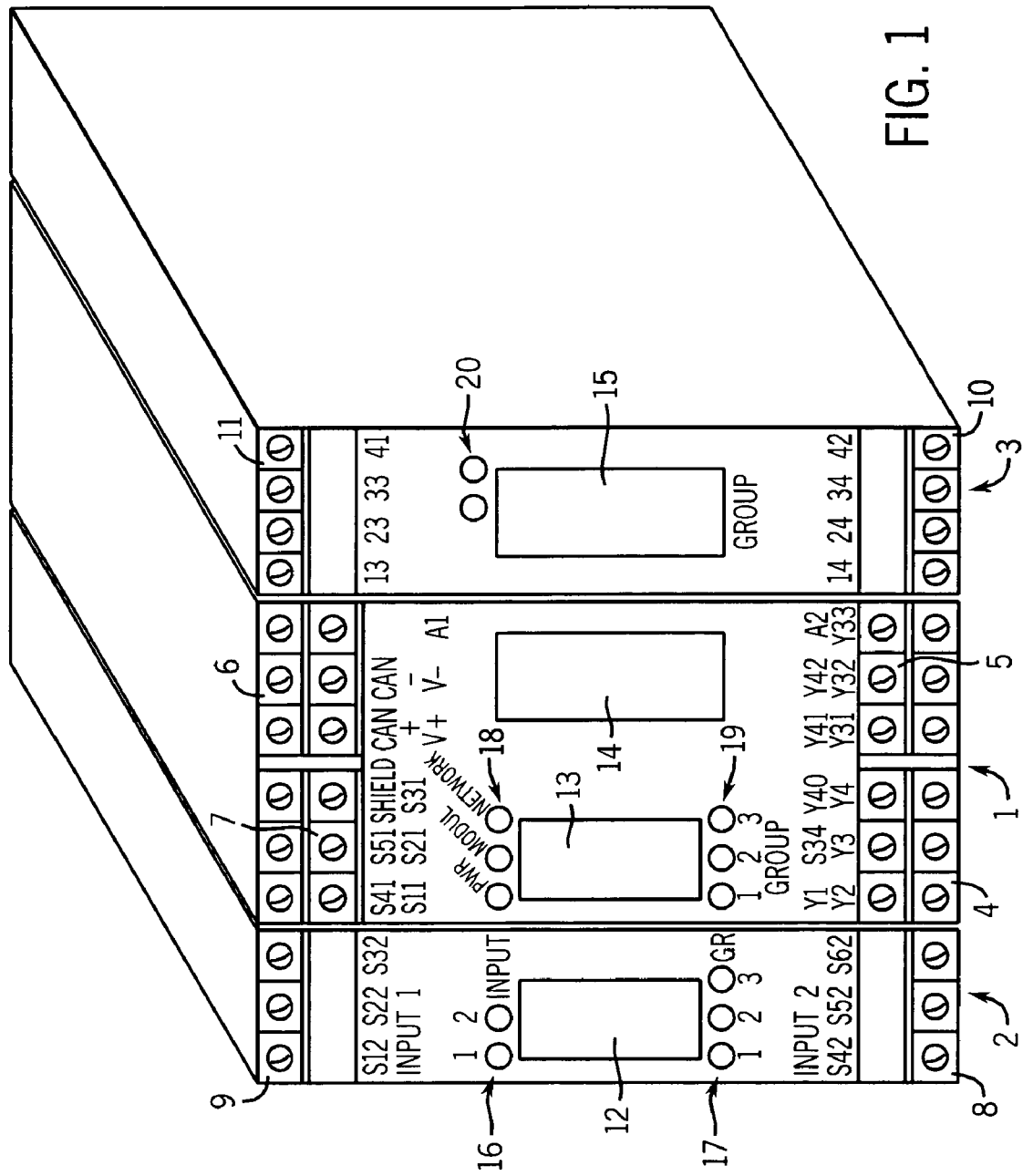
FIG. 1 is a perspective view of a modular safety system including three modules.

Referring to FIG. 1, a modular safety system is shown that includes a base module 1, an input module 2, and an output module 3. These modules 1, 2, 3 are arranged in a side by side fashion on a mounting rail (not shown). The base module 1 includes two lower terminal rows 4, 5 and two upper terminal rows 6, 7 for attaching the necessary cable connections for input and output signals, power supply, reset configuration, outputs for safety loops, device net, etc.

Also the input module 2 as well as the output module 3 both include a lower terminal row 8, 10 and an upper terminal row 9, 11, each including various terminals.

In the input module 2, the upper terminal 9 serves as first input, whereas the lower terminal row serves as second input in the illustrated configuration, with a maximum of three channel activations. The modules 1, 2, 3 are interconnected by two different types of flat cables (not shown) through their sockets 12, 13, 14, and 15. Socket 12 of the input module is interconnected through such a cable with socket 13 of the base module for delivering input information for the base module, whereas socket 14 is connected to socket 15 of the output module to transport the output information to the output module 3. Further, a plurality of LEDs in each module provides for information about the state of associated modules 1, 2, 3.

Figure 2:
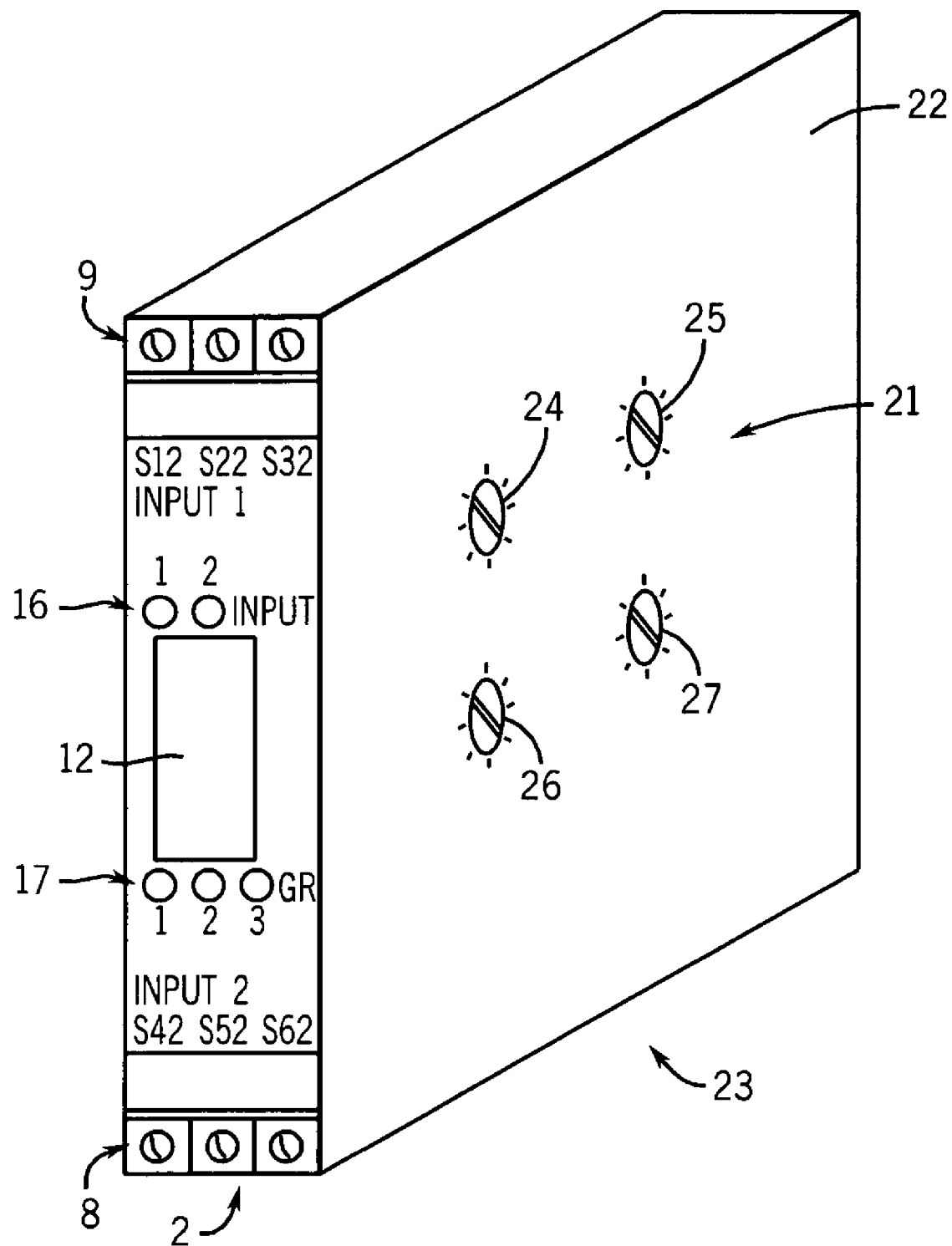
FIG. 2 is a perspective view of an input module with a setting means located on one side of the input module.

Because a plurality of input modules 2 may be connected to base module 1 as well as a plurality of output modules 3 may be connected base module 1, it is advantageous to define input and output functions for the modular safety system. As shown in FIG. 2, the input module 2 includes a setting means 21 in a side wall 22 of the housing 23 of the input module 2. In accordance with one embodiment, the setting means 21 includes a first pair of rotary switches 24, 25 and a second pair of rotary switches 26 and 27. The first pair 24 and 25 is used for the definition of the input functions, whereas the second pair of rotary switches 26 and 27 is used for the definition of the output functions. Preferably, the rotary switches 24, 25, 26, 27 are operable by the use of a screw driver and are provided in the side wall 22 of the housing to be flush with the side wall 22. Further, for redundancy reasons, each input definition is two-fold by the use of two independent rotary switches. Also for the output functions two rotary output switches 26 and 27 are used. With the use of the arrangement of these setting means 21 in a side wall 22 of the input modules, the definition of input and output functions is not accessible after the module safety system has been arranged on the mounting rail due to of the protection of those rotary switches 24, 25, 26, and 27 by the adjacent side wall of the base module 1, as shown in FIG. 1. In accordance with the illustrated embodiment, each rotary switch comprises 10 steps.

The invention claimed is:

1. A modular safety system for safety control in emergency stop applications, comprising:
    a base module and at least one expansion module, wherein each module is arranged in a respective housing with a rail mounting base so that the base module and the at least one expansion module are configurable in a side-by-side arrangement mounted to the rail;
    means for setting input and output functions of the modular safety system located on a side of the housing of at least one of the base module and the at least one expansion module; and
    wherein the means for setting is covered by an adjacent module when the base module and the at least one expansion module are mounted in the side-by-side arrangement on the rail.

2. The system of claim 1 wherein the adjacent expansion module includes an input module with at least one input channel.

3. The system of claim 1 wherein the setting means includes at least one rotary switch.

4. The system of claim 3 wherein the setting means includes two independent rotary switches for setting input functions and two independent rotary switches for setting output functions.

5. The system of claim 4 wherein each rotary switch includes a plurality of steps.

6. The system of claim 1 wherein the at least one expansion module includes at least one output module.

7. The system of claim 6 wherein the output module includes a 22.5 mm housing.

8. The system of claim 1 wherein the at least one expansion module includes at least one input module having two input channels.

9. The system of claim 1 wherein the two input channels include at least one of a single-channel activation, a dual-channel activation, and a three-channel activation.

10. The system of claim 1 wherein the base module includes a 35 mm housing.

11. The system of claim 2 wherein the input module includes a 17.5 millimeter (mm) housing.

\* \* \* \* \*